United States Patent
Carey

(10) Patent No.: US 7,405,935 B1
(45) Date of Patent: Jul. 29, 2008

(54) SERVICE TRAY FOR A THERMAL MANAGEMENT SYSTEM

(75) Inventor: John A. Carey, Athol, ID (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 0 days.

(21) Appl. No.: 11/564,179

(22) Filed: Nov. 28, 2006

(51) Int. Cl.
*H05K 7/20* (2006.01)
*F28F 7/00* (2006.01)

(52) U.S. Cl. .......... 361/699; 361/700; 361/718; 165/80.1; 165/104.33; 165/908

(58) Field of Classification Search ......... 361/698–703; 165/80.4–80.5, 104.33, 908; 62/259.2
See application file for complete search history.

(56) References Cited

U.S. PATENT DOCUMENTS

| | | | | |
|---|---|---|---|---|
| 5,907,473 A | * | 5/1999 | Przilas et al. ............... | 361/699 |
| 6,644,058 B2 | * | 11/2003 | Bash et al. ................. | 62/259.2 |
| 7,150,109 B2 | * | 12/2006 | Knight et al. ................ | 34/62 |
| 7,180,741 B1 | * | 2/2007 | Knight et al. ............... | 361/699 |
| 7,264,042 B1 | * | 9/2007 | Tilton et al. ............ | 165/104.33 |
| 2005/0138833 A1 | * | 6/2005 | Knight et al. ................ | 34/209 |
| 2006/0082970 A1 | * | 4/2006 | Walz et al. .................. | 361/699 |

* cited by examiner

*Primary Examiner*—Jayprakash N Gandhi
*Assistant Examiner*—Robert J Hoffberg
(74) *Attorney, Agent, or Firm*—Michael S. Neustel

(57) ABSTRACT

A service tray for a thermal management system for providing convenient access to components within a liquid thermal management system. The service tray for a thermal management system includes a chassis with an opening and a support unit slidably positioned within the opening. The support unit receives various thermal management devices such as a coolant pump, a filter, a heater and the like. A first rail and a second rail are attached within the interior of the chassis that movably receive a first guide and a second guide of the support unit respectively. Electrical and fluid connectors attached to the chassis and the support unit allow for the connection of the thermal management devices on the support unit to the chassis.

27 Claims, 12 Drawing Sheets

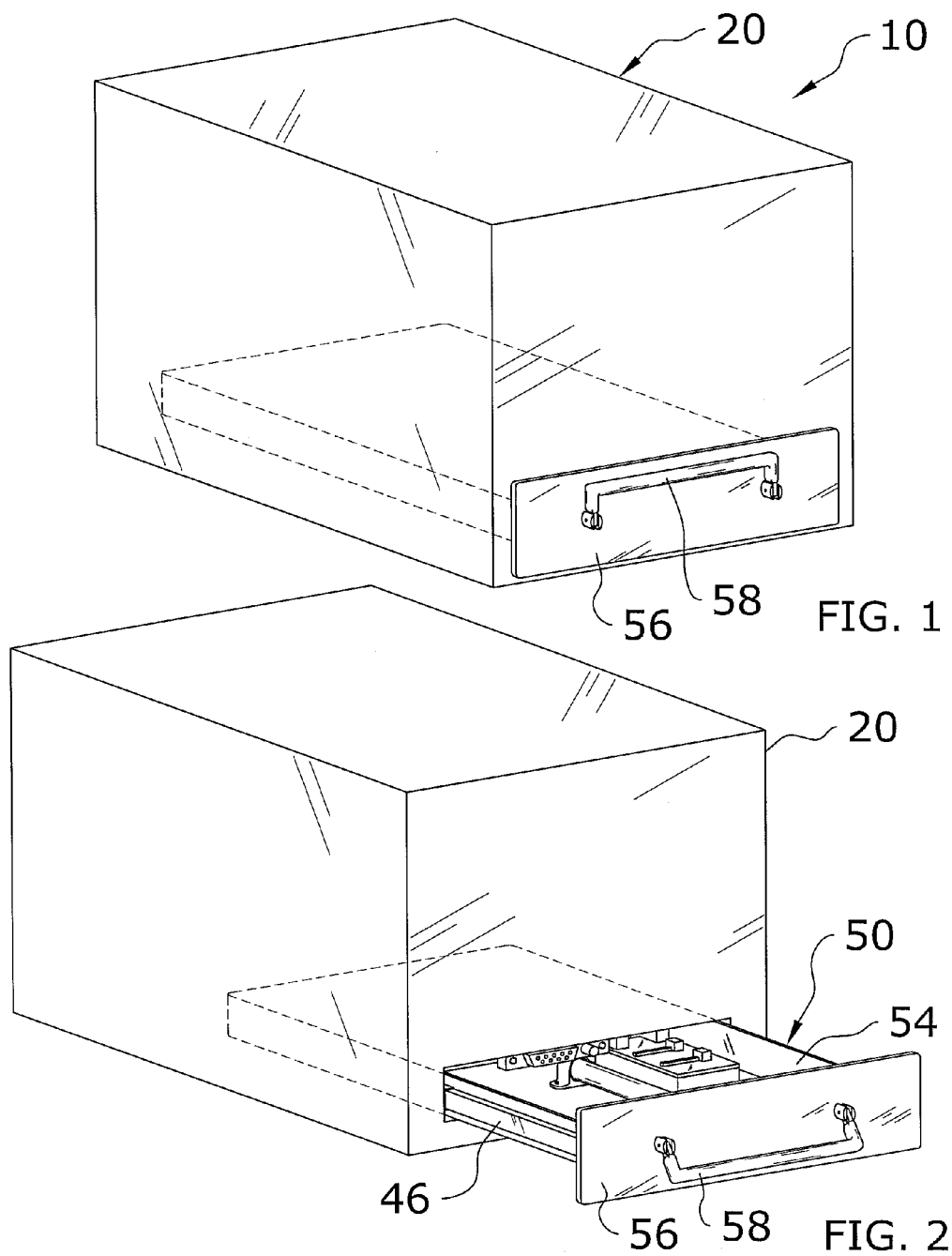

SERVICE TRAY FOR A THERMAL MANAGEMENT SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to liquid thermal management systems and more specifically it relates to a service tray for a thermal management system for providing convenient access to components within a liquid thermal management system.

2. Description of the Related Art

Any discussion of the prior art throughout the specification should in no way be considered as an admission that such prior art is widely known or forms part of common general knowledge in the field.

Single-phase liquid thermal management systems (e.g. liquid cold plates) and two-phase liquid thermal management systems (e.g. spray cooling, pool boiling, flow boiling, jet impingement cooling, falling-film cooling, parallel forced convection, curved channel cooling and capillary pumped loops) have been in use for years for thermally managing various types of heat producing devices. Spray cooling technology is being adopted today as the most efficient option for thermally managing electronic systems. U.S. Pat. No. 5,220,804 entitled High Heat Flux Evaporative Spray Cooling to Tilton et al. describes the earlier versions of spray technology, as it relates to cooling electronics. U.S. Pat. No. 6,108,201 entitled Fluid Control Apparatus and Method for Spray Cooling to Tilton et al. also describes the usage of spray technology to cool a printed circuit board.

Conventional liquid thermal management systems typically are comprised of a chassis for housing the thermal management components and the electronic components being thermally managed. An access door is removably attached to the chassis using conventional fasteners (e.g. bolts) thereby selectively closing an access opening within the chassis. When the access door is removed, a service technician is able to access the thermal management components (e.g. pumps, filters, heaters, valves, spray units, etc.) to repair, replace or test.

One problem with conventional liquid thermal management systems is that the service technician can have a difficult time accessing the thermal management components within the chassis. Another problem with conventional liquid thermal management systems is that visibility can be limited within the interior of the chassis making it difficult to locate, view or monitor thermal management components. A further problem with conventional liquid thermal management systems is that liquid coolant is susceptible to contamination and loss when the access door is opened. Another problem with conventional liquid thermal management systems is that the access door can be time consuming to open and close.

BRIEF SUMMARY OF THE INVENTION

In view of the foregoing disadvantages inherent in the known types of liquid thermal management systems now present in the prior art, the present invention provides a new service tray for a thermal management system construction wherein the same can be utilized for providing convenient access to components within a liquid thermal management system.

The general purpose of the present invention, which will be described subsequently in greater detail, is to provide a new service tray for a thermal management system that has many of the advantages of the liquid thermal management systems mentioned heretofore and many novel features that result in a new service tray for a thermal management system which is not anticipated, rendered obvious, suggested, or even implied by any of the prior art liquid thermal management systems, either alone or in any combination thereof.

The present invention relates to a system generally comprising a chassis with an opening and a support unit slidably positioned within the opening. The support unit receives various thermal management devices such as a coolant pump, a filter, a heater and the like. A first rail and a second rail are attached within the interior of the chassis that movably receive a first guide and a second guide of the support unit respectively. Electrical and fluid connectors attached to the chassis and the support unit allow for the connection of the thermal management devices on the support unit to the chassis.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

An object is to provide a service tray for a thermal management system that may be utilized in various types of liquid thermal management systems.

An additional object is to provide a service tray for a thermal management system that provides increased access and visibility to thermal management components (e.g. valves, pumps, filters, heaters).

A further object is to provide a service tray for a thermal management system that reduces the amount of coolant loss and coolant contamination incurred when a thermal management unit is serviced.

Another object is to provide a service tray for a thermal management system that is efficient to open and close.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein:

FIG. 1 is an upper perspective view of the present invention.

FIG. 2 is an upper perspective view of the support unit partially removed from the chassis.

FIG. 18 is a top view of the support unit having a plurality of apertures within the floor to allow coolant to pass through.

DETAILED DESCRIPTION OF THE INVENTION

A. Overview

Figure 3:
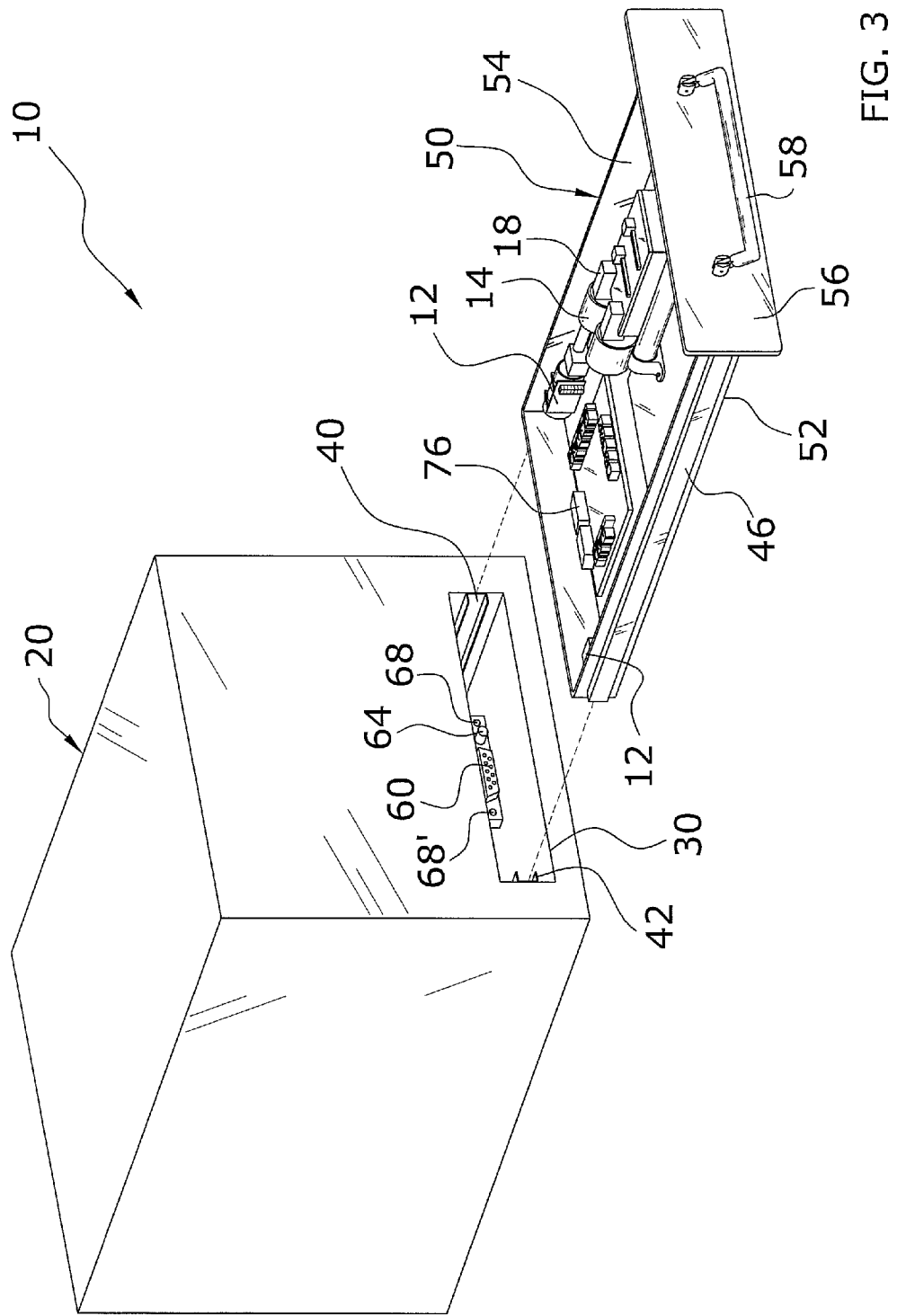
FIG. 3 is an upper perspective view of the support unit fully removed from the chassis.

Turning now descriptively to the drawings, in which similar reference characters denote similar elements throughout the several views, FIGS. 1 through 18 illustrate a service tray for a thermal management system 10, which comprises a chassis 20 with an opening 30 and a support unit 50 slidably positioned within the opening 30. The support unit 50 receives various thermal management devices such as a coolant pump 14, a filter 16, a heater 18 and the like. A first rail 40 and a second rail 42 are attached within the interior of the chassis 20 that movably receive a first guide 44 and a second guide 46 of the support unit 50 respectively. Electrical and fluid connectors attached to the chassis 20 and the support unit 50 allow for the connection of the thermal management devices on the support unit 50 to the chassis 20.

B. Chassis

FIGS. 1 through 4 illustrate the chassis 20. The chassis 20 may be comprised of various liquid thermal management chassis 20 structures used to house and thermally manage heat producing devices 11 (e.g. microprocessors, circuit boards, etc.). The chassis 20 may have various shapes as can be appreciated. The chassis 20 includes at least one interior cavity 22. The interior cavity 22 is sized sufficiently to include various electronic components along with liquid thermal management devices that thermally manage the electronic components.

The chassis 20 includes one or more openings 30 connecting to the interior cavity 22 as shown in FIG. 3 of the drawings. The opening 30 has a size and shape designed to removably receive a support unit 50. The opening 30 preferably is comprised of an elongated rectangular shape to receive a similar cross sectional shaped support unit 50 as shown in FIG. 3 of the drawings. The opening 30 is preferably positioned within a lower portion of the chassis 20 to position the support unit 50 near the lower portion of the chassis 20 so that an intake port 70 fluidly connects to an intake valve 12 positioned within the liquid coolant.

C. Liquid Thermal Management Unit

At least one liquid thermal management unit is positioned within the chassis 20 to thermally manage at least one heat producing device. The liquid thermal management unit may be comprised of a single-phase liquid thermal management system (e.g. liquid cold plate) or a multi-phase liquid thermal management system (e.g. spray cooling).

Figure 5:
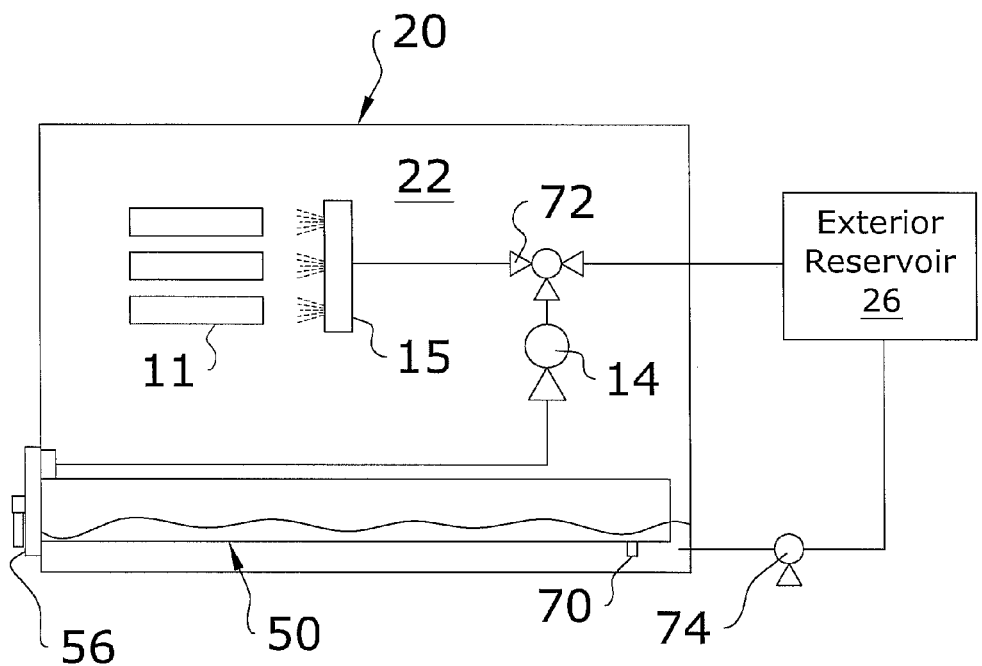
FIG. 5 is a schematic illustration of the present invention with an external reservoir.
Figure 8:
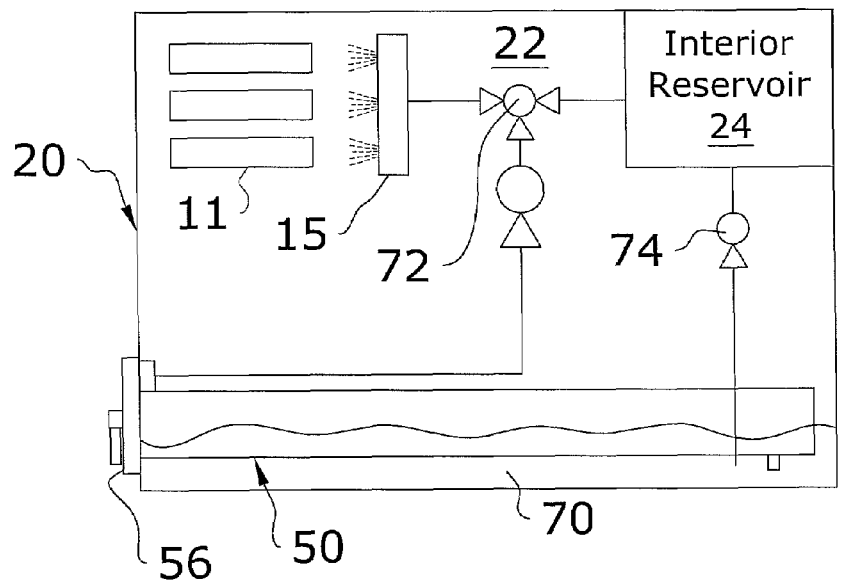
FIG. 8 is a schematic illustration of the present invention with an interior reservoir.
Figure 16:
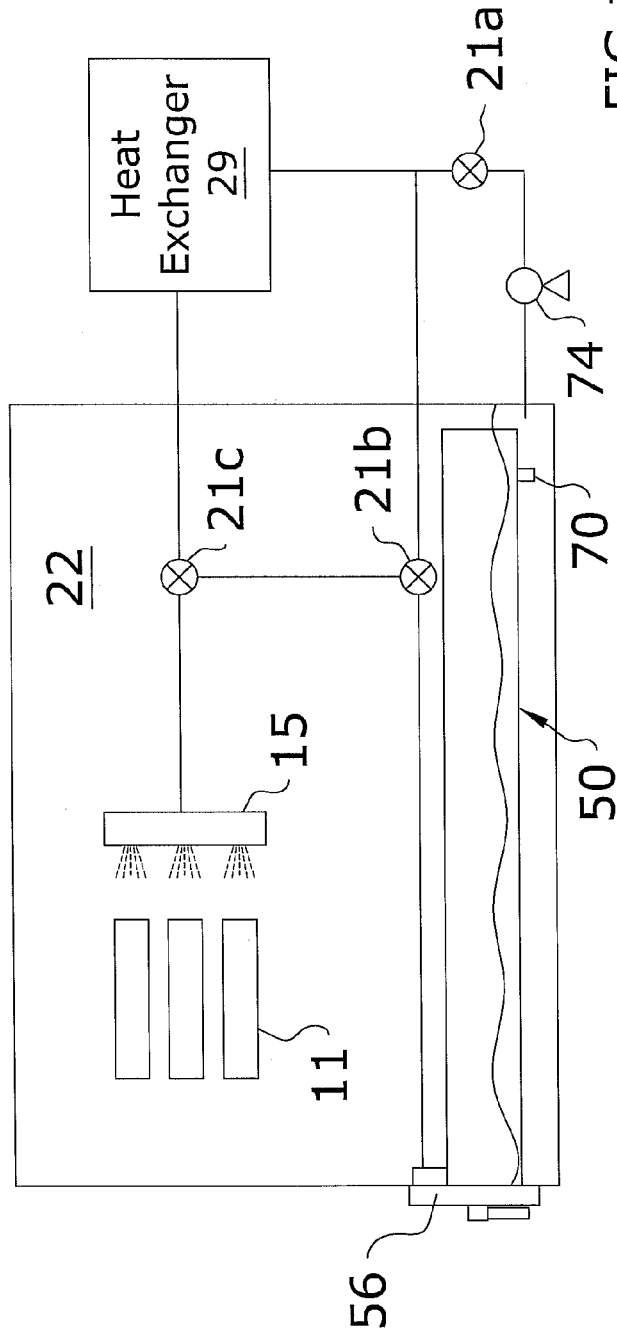
FIG. 16 is a schematic illustration of another alternative embodiment utilizing an external heat exchanger as a coolant reservoir.

Because of the inherent efficiencies, it is preferable that the liquid thermal management unit is comprised of a spray cooling technology. The liquid thermal management unit preferably includes at least one spray unit 15 to spray atomized coolant upon the heat producing device as illustrated in FIGS. 5, 8 and 16 of the drawings. FIGS. 5, 8 and 16 illustrate the spray unit 15 spraying a coolant upon the heat producing devices 11 to thermally manage the same. U.S. Pat. No. 5,220,804 entitled High Heat Flux Evaporative Spray Cooling to Tilton et al. and U.S. Pat. No. 6,108,201 entitled Fluid Control Apparatus and Method for Spray Cooling to Tilton et al. illustrate an exemplary spray cooling technology and are hereby incorporated by reference.

D. Support Unit

Figure 4:
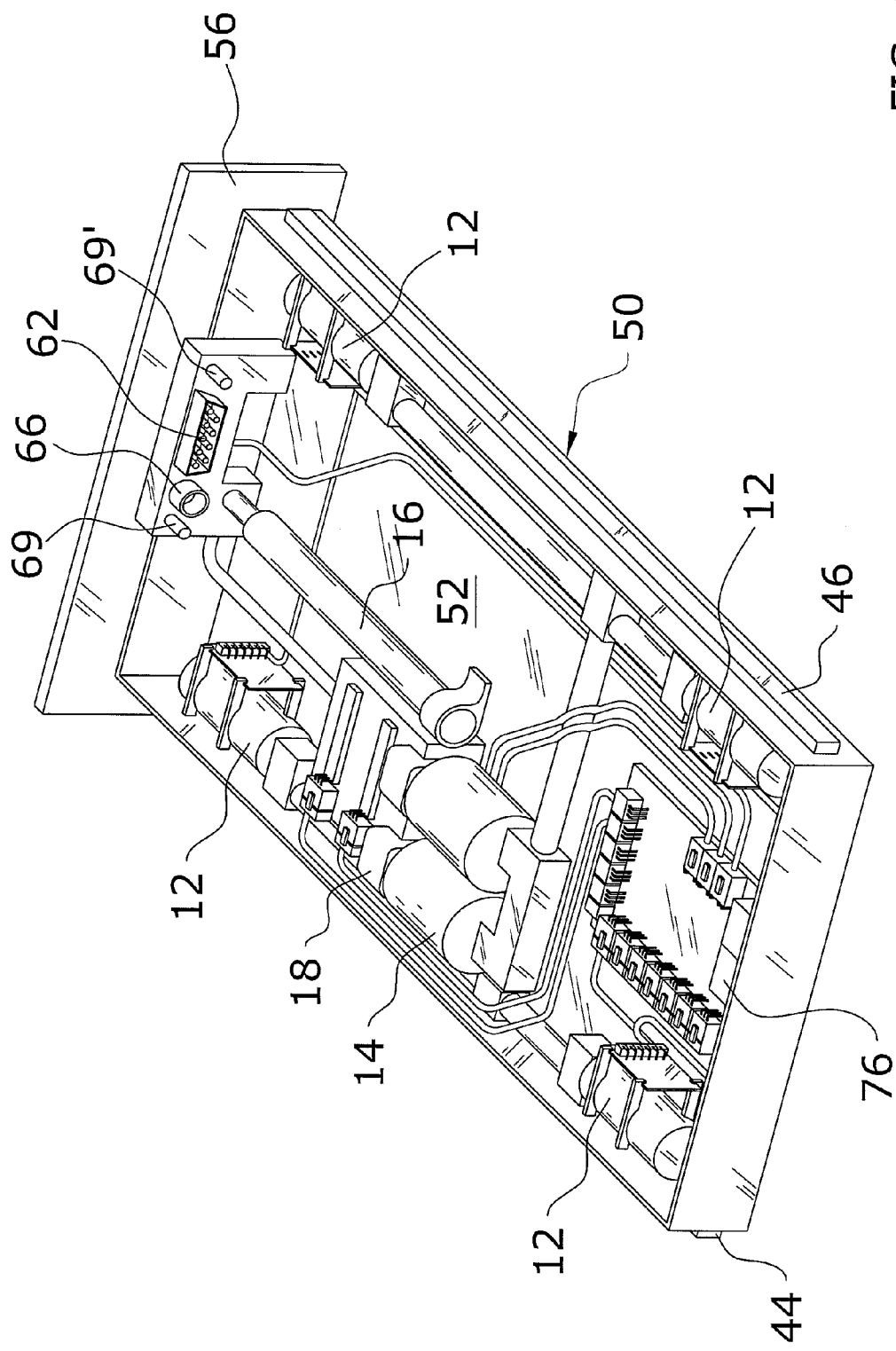
FIG. 4 is an upper perspective view of the support unit.

FIGS. 2 through 4 illustrate an exemplary support unit 50 that is slidably positioned within the opening 30 of the chassis 20 in a removable manner. The support unit 50 seals the opening 30 when in a closed state with respect to the chassis 20 as shown in FIG. 1 of the drawings. In addition, the support unit 50 is at least partially removable from the chassis 20 in an open state to allow access to the various liquid thermal management devices attached to the support unit 50 as shown in FIGS. 2 and 3 of the drawings. It is preferable that the support unit 50 is completely removable from the chassis 20 to allow the support unit 50 to be easily worked upon in a different location or to allow complete replacement of the support unit 50 as shown in FIG. 3 of the drawings.

Figure 18:
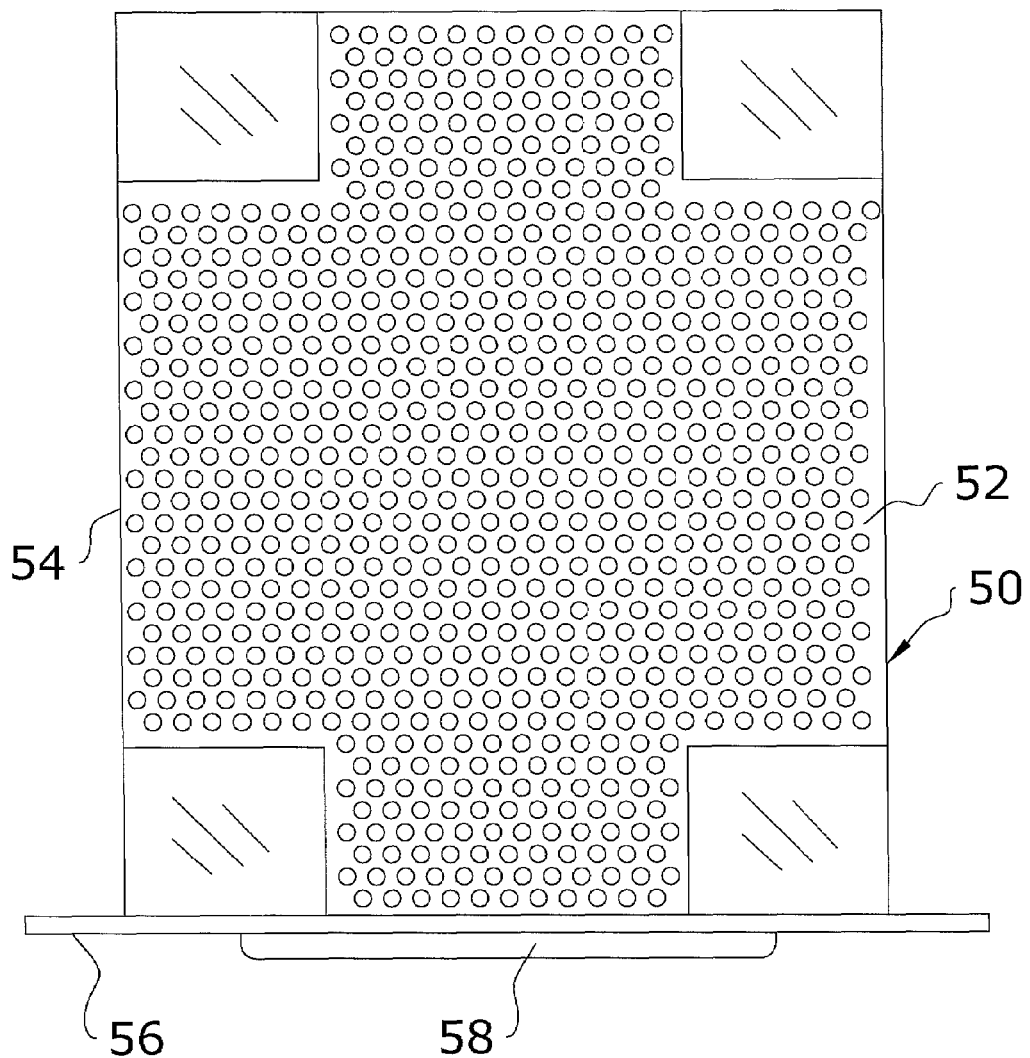

The support unit 50 preferably includes at least one floor 52 to attach the liquid thermal management devices to as shown in FIGS. 3 and 4 of the drawings. The floor 52 preferably includes one or more apertures to allow coolant to pass through the floor 52 when positioned within the interior cavity 22 of the chassis 20. FIG. 18 provides a preferred embodiment of the support unit 50 illustrating a plurality of apertures within the central portions of the floor 52 leaving the interior corners of the support unit 50 with a relatively solid structure to prevent coolant from passing through where the intake valves 12 are positioned to create an artificial representation of the fluid location within the interior reservoir 24 during the rotation of the chassis 20. The support unit 50 also preferably includes a plurality of sidewalls 54 extending from a perimeter of the floor 52. A pair of opposing and parallel sidewalls 54 extend along the sides of the floor 52 to receive the sliding support structure.

The support unit 50 further includes an end member 56 attached to a distal end of the floor 52 and to the sidewalls 54. The end member 56 is broader than the opening 30 within the chassis 20 and seals the opening 30 when the support unit 50 is in the closed state. A seal is preferably attached either to the chassis 20 around the opening 30 or to the end member 56 to seal the opening 30 when the support unit 50 is in the closed state.

A latching structure is utilized to secure the support unit 50 within the chassis 20 when in the closed state. A U-shaped handle 58 is preferably attached to the end member 56 in a pivoting manner. The handle 58 is preferably mechanically connected to the latching structure to secure the support unit 50 within the chassis 20. When the handle 58 is pivoted outwardly to pull the support unit 50 outward from the chassis 20 as shown in FIGS. 2 and 3 of the drawings, the latching structure is released thereby allowing the support unit 50 to be released. When the handle 58 is pivoted upwardly as shown in FIG. 1 of the drawings, the latching structure is manipulated into a latching position to prevent the support unit 50 from leaving the closed state. Alternatively, a plurality of conventional fasteners (e.g. screws, bolts) may secure the support unit 50 within the chassis 20.

A plurality of liquid thermal management devices are attached to the support unit 50. The liquid thermal management devices are comprised of various components utilized to operate the liquid thermal management system. The liquid thermal management devices attached to the support unit 50 are preferably comprised of at least one coolant pump 14, at least one filter 16, at least one heater 18, at least one intake valve 12 and at least one control unit 76. The liquid thermal management devices are fluidly connectable to a liquid thermal management unit (e.g. spray unit 15) within the chassis 20 that is used to thermally manage one or more heat producing devices 11.

Figure 9:
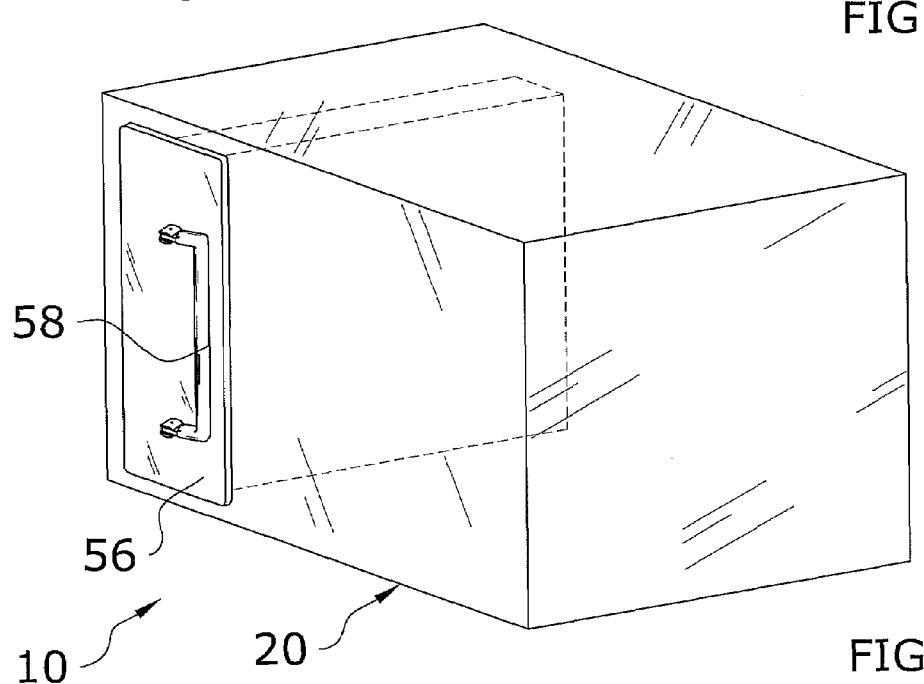
FIG. 9 is an upper perspective view of the present invention with the support unit in an alternative vertical state.
Figure 10:
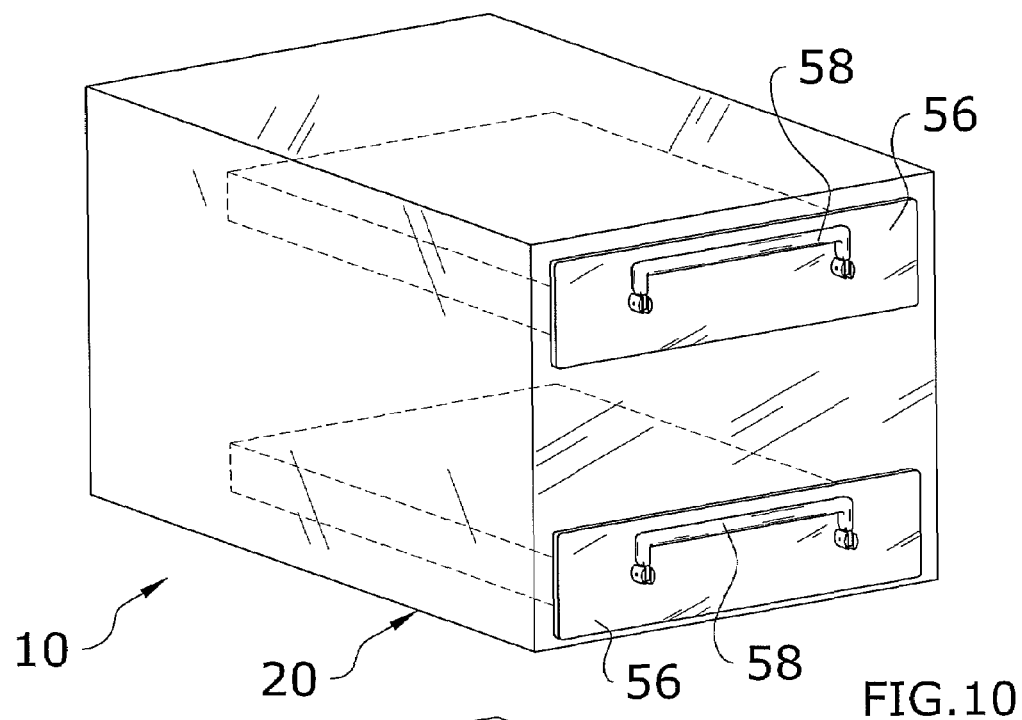
FIG. 10 is an upper perspective view of the present invention with a first support unit positioned in a lower portion of the chassis and a second support unit positioned in an upper portion of the chassis.
Figure 11:
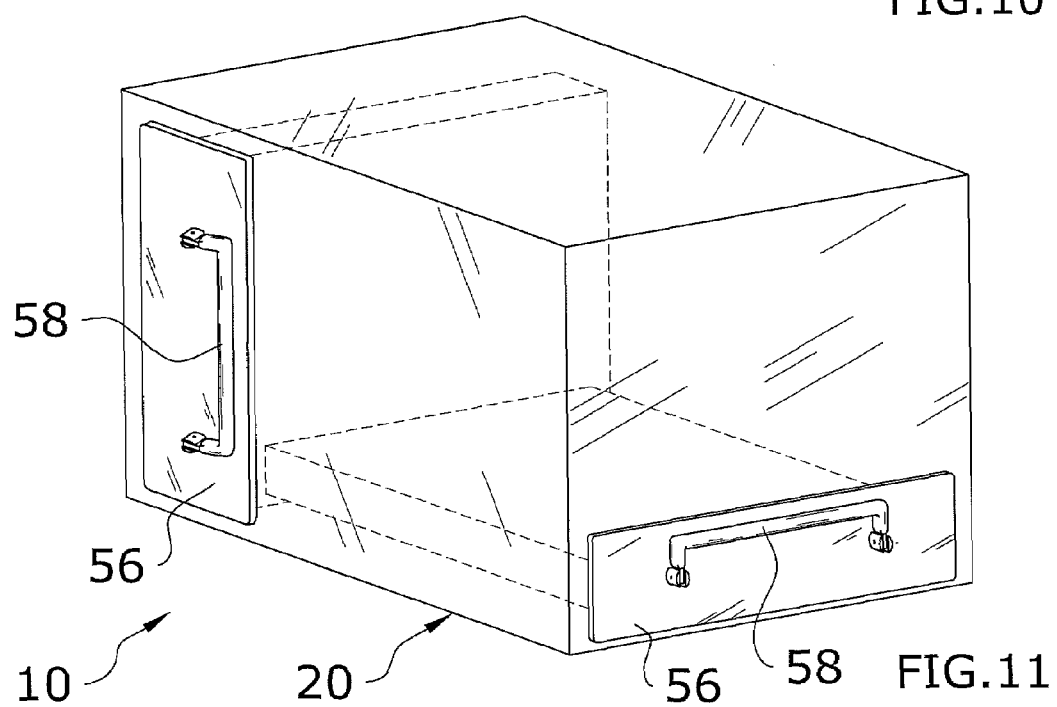
FIG. 11 is an upper perspective view of the present invention with a first support unit in a horizontal state and a second support unit in a vertical state.

However, in alternative embodiments illustrated in FIGS. 9 through 11, the opening 30 may be positioned in a vertical manner in the rear portion of the chassis 20 to allow the support unit 50 to be positioned in a vertical manner. In addition, a plurality of openings 50 are preferably used when multiple support units 50 are positioned within the chassis such as shown in FIGS. 10 and 11 of the drawings. FIG. 10 illustrates the support unit 50 positioned within a lower portion and an upper portion of the chassis 20 to allow for the operation of the thermal management system regardless of the attitude of the chassis (e.g. inverted). FIG. 11 provides another variation wherein one of the support units 50 is positioned in the rear portion in a vertical manner and a second support unit 50 is positioned in a horizontal position substantially near the vertically orientated support unit 50. Other combinations or variations of the above-stated support unit 50 arrangements may be desirable depending on the operating parameters of the system.

E. Sliding Support Structure

As stated previously, the support unit 50 is slidably supported within the chassis 20 to allow for efficient removal of the support unit 50 from the chassis 20 and replacement thereof. A first rail 40 and a second rail 42 are preferably attached within the chassis 20. The rails 40, 42 preferably extend a substantial distance into the interior cavity 22 of the chassis 20 and may be attached to the interior walls or the lower portion of the chassis 20.

The rails 40, 42 slidably receive a corresponding first guide 44 and a second guide 46 attached to the support unit 50 as best illustrated in FIG. 3 of the drawings. The rails 40, 42 are preferably adjacent the opening 30 to immediately receive a front portion of the guides 44, 46 as shown in FIG. 3 of the drawings. The guides 44, 46 are preferably attached to opposite sides of the support unit 50 as shown in FIGS. 3 and 4 of the drawings.

The sliding support structure may be comprised of various sliding support technologies (e.g. ball bearing sliding rail), however it is preferable that the rails 40, 42 are comprised of channels that slidably receive the guides 44, 46 where the guides 44, 46 are comprised of corresponding elongated structures.

F. Electrical Connectors

FIGS. 3 and 4 of the drawings respectively illustrate a first electrical connector 60 attached to the chassis 20 and a second electrical connector 62 attached to the support unit 50. The second electrical connector 62 is electrically connected to the first electrical connector 60 when the support unit 50 is in the closed state to allow for electrical communication between the chassis 20 and the devices on the support tray as shown in FIG. 1 of the drawings. The electrical connectors 60, 62 are preferably comprised of a male and female combination. Various electrical connectors may be utilized within the electrical connectors 60, 62 as needed to operate the devices on the support unit 50. Alternatively, the connector(s) on the support unit 50 may be movably positioned via a lever, such as the handle latch, to facilitate matably making and breaking the electrical connections before fluid connections are broken or made, respectively (e.g. the electrical connection is broken before the fluid connection is broken, and the fluid connection is made before the electrical connection is made).

The second electrical connector 62 is electrically connected to at least one of the plurality of liquid thermal management devices (e.g. coolant pump 14, intake valve 12, control unit 76). Electrical power is provided to the devices on the support unit 50 when the first electrical connector 60 is electrically connected to the second electrical connector 62.

The first electrical connector 60 is preferably positioned within the interior cavity 22 of the chassis 20 adjacent to the opening 30 as shown in FIG. 3 of the drawings. The first electrical connector 60 may alternatively be positioned external of the chassis 20. The second electrical connector 62 is preferably attached to an inner surface of the end member 56 of the support unit 50 aligned with the first electrical connector 60. However, the second electrical connector 62 may be connected to various other portions of the support unit 50. The electrical connectors 60, 62 preferably provide for the transfer of electrical power, commands and data between the devices on the support unit 50 and the devices within the chassis 20.

G. Fluid Connectors

Figure 17:
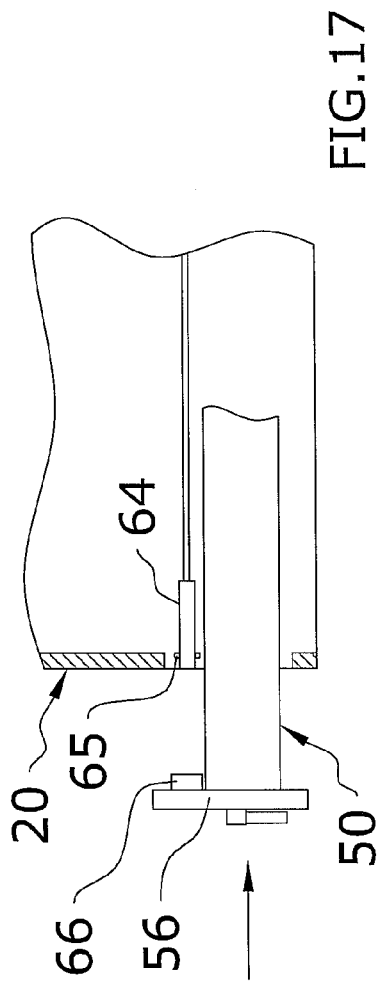
FIG. 17 is a magnified side cutaway view illustrating the second fluid connector of the support unit removed from the first fluid connector of the chassis.

A first fluid connector 64 is attached to the chassis 20 and a second fluid connector 66 is attached to the support unit 50 as illustrated in FIGS. 3 and 4 of the drawings respectively. The second fluid connector 66 is fluidly connected to the first fluid connector 64 when the support unit 50 is in the closed state as shown in FIG. 1 of the drawings. As best illustrated in FIG. 17 of the drawings, a connector seal 65 (e.g. O-ring) preferably is attached to the first fluid connector 64 or alternatively to the second fluid connector 66 to provide a sealed connection between the connectors 64, 66.

The second fluid connector 66 is fluidly connected to at least one of the plurality of liquid thermal management devices on the support unit 50 (e.g. coolant pump 14). The second fluid connector 66 is preferably connected to the outlet port of the coolant pump 14 and the first fluid connector 64 is preferably connected to the spray unit 15 to provide pressurized coolant from the coolant pump 14 to the spray unit 15.

Figure 12:
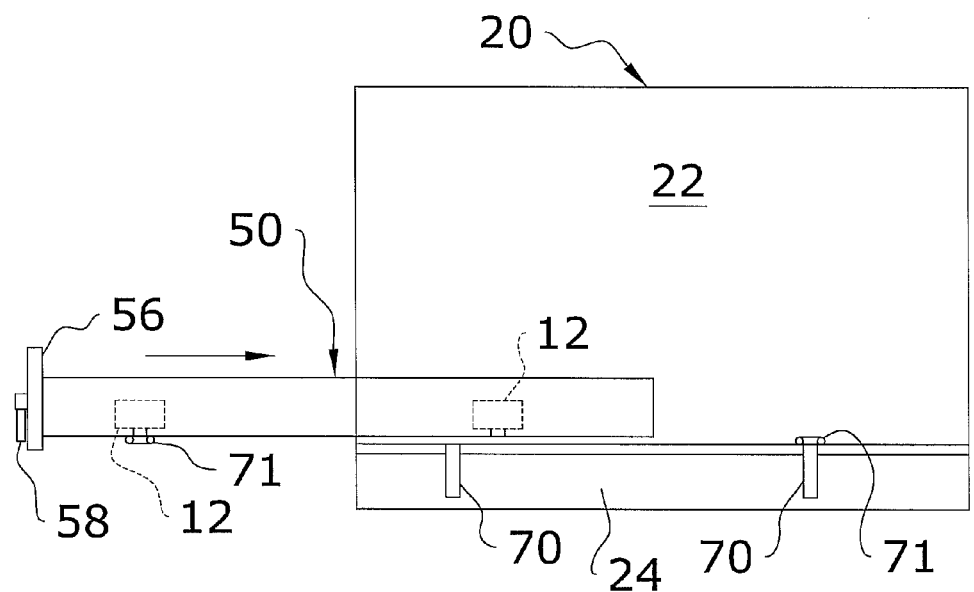
FIG. 12 is a side illustration of the support unit partially removed from the chassis with an interior reservoir in the lower portion of the chassis.
Figure 13:
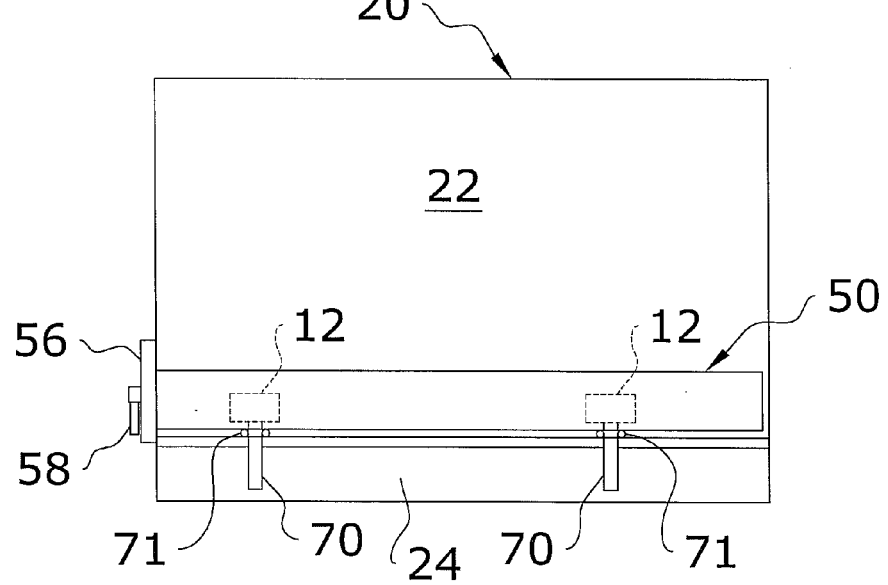
FIG. 13 is a side illustration of the support unit in a closed state with respect to the chassis with seals fluidly connecting the intake ports with the intake valves on the support unit.
Figure 14:
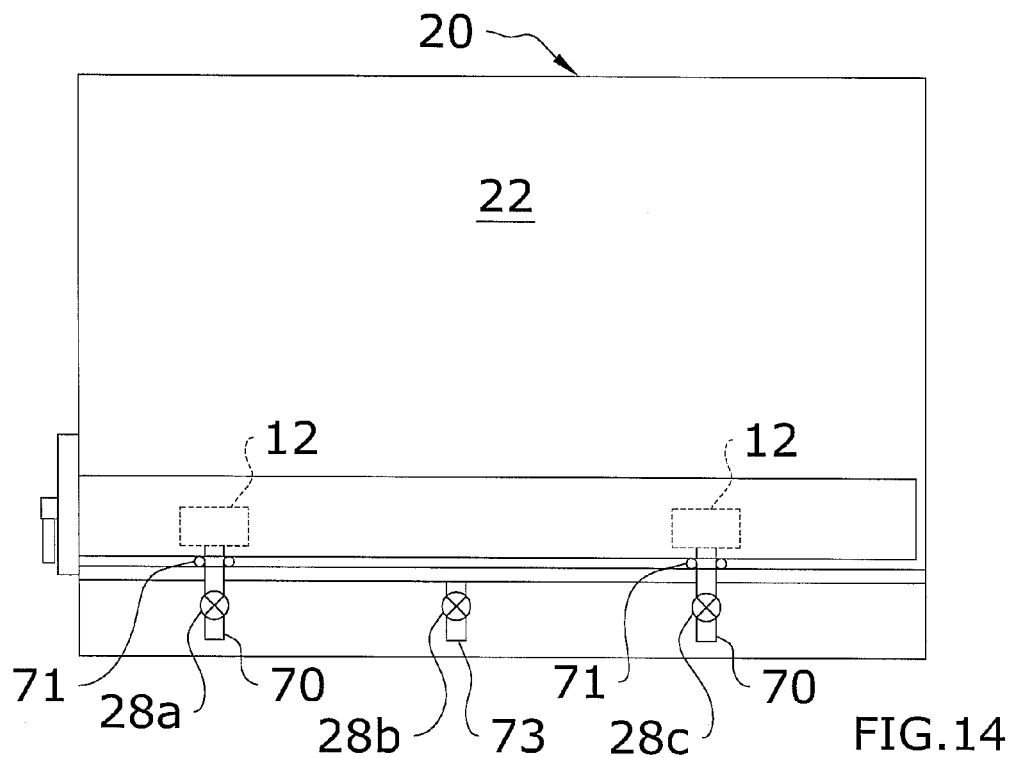
FIG. 14 is a side illustration of an alternative embodiment utilizing a drain tube to allow coolant to drain into the lower reservoir during operation thereof.
Figure 15:
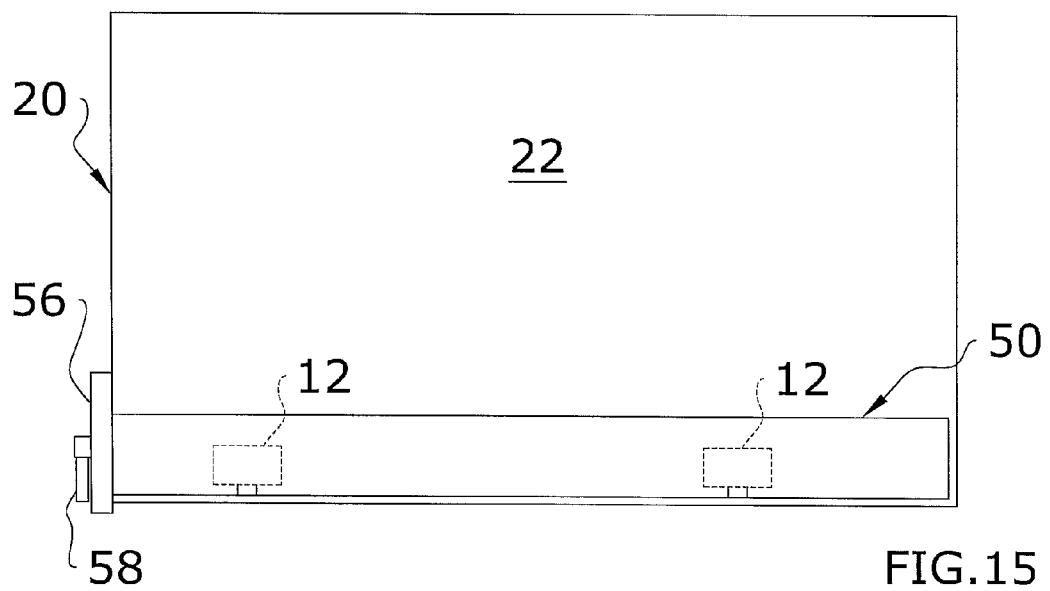
FIG. 15 is a side illustration of another alternative embodiment illustrating the support unit positioned within a lower portion of the chassis without utilizing an intake port or interior reservoir.

Preferably, the fluid connections between the support unit 50 and the chassis 20 are "connectorless" thereby eliminating potential pressure drops within the coolant system as shown in FIGS. 5, 8, 12, 13, 14 and 16 of the drawings. This may be accomplished by using compressive or sliding seals between the support unit 50 and the chassis 20 or an interior reservoir 24. FIGS. 5, 8, 16 illustrate utilizing an intake port 70 extending outward from the support unit 50 to draw liquid coolant into the intake valves 12. FIGS. 12 through 14 illustrate utilizing a sliding seal 71 configuration where a seal 71 is connected to an interior reservoir 24 within the chassis 50 and an aperture for the intake valve 12 is aligned and sealed with the seal 71 when the support unit 50 is closed within the chassis. FIG. 12 illustrates one seal 71 being attached to the support unit 50 and a second seal 71 being attached to the interior reservoir 24.

FIG. 14 illustrates a drain tube 73 fluidly connected to the interior reservoir 24 to collect coolant that passes around the support unit 50 with a sealing valve 28b connected within that selectively closes when the support unit 50 is removed from the chassis 20. The upper part of the lower reservoir 24 is preferably angled toward the opening of the drain tube 73 to ensure that a substantial portion of the coolant is returned to the lower reservoir 24 prior to removing the support tray 50. FIG. 14 further illustrates sealing valves 28a, 28b fluidly connected within the intake ports 70 attached to a portion of the reservoir 24 that also selectively close when the support unit 50 is removed from the chassis 20.

H. Intake Valve

At least one intake valve 12 is preferably attached to the support unit 50 to collect coolant within a lower portion of the chassis 20 when the support tray is positioned in the closed state within the chassis 20. It is preferable to utilize more than one intake valve 12 located in various emplacements upon the support unit 50 to ensure that regardless of the attitude of the chassis 20 that coolant within the lower portion of the chassis 20 will be collected for the coolant pumps 14. The intake valve 12 may open or close based upon the presence of coolant in the location of the intake valve 12.

The intake valves 12 each preferably include a fluid sensor that detects the presence of fluid near or at the intake valve 12. The fluid sensor may be comprised of any type of sensor capable of determining the presence of fluid (e.g. capacitive sensor, optical sensor, etc.). The fluid sensor may directly control the state of the intake valve 12 or it may be in communication with the control unit 58 which then determines the state of the intake valve 12. The value of the fluid sensor determines if a specific intake valve 12 should be opened or closed (e.g. if fluid is present the intake valve 12 would preferably be opened and vice versa).

An intake port 70 is fluidly connected to the at least one intake valve 12 as shown in FIG. 3. The intake port 70 extends outwardly from a surface that interfaces with the support unit 50 to collect coolant within a reservoir or fluid collection portion of the chassis 20 as best illustrated in FIGS. 3 and 5 of the drawings. The intake port 70 is preferably comprised of an elongated tubular structure that extends into the reservoir for fluid pickup.

I. Guide Structure

To ensure proper alignment of the electrical connectors 60, 62 and the fluid connectors 64, 66, at least one guide aperture extends within the chassis 20 and at least one guide member is attached to the support unit 50 (or vice versa) as shown in FIGS. 3 and 4 of the drawings.

The guide members 69, 69' are positioned within the guide apertures 68, 68' when the support unit 50 is in a closed state. The guide members 69, 69' are preferably aligned substantially parallel to a path of sliding that the support unit 50 follows when being inserted and removed with respect to the chassis 20. The guide members 69, 69' preferably initially enter the guide apertures 68, 68' prior to any connection of the electrical connectors 60, 62 or the fluid connectors 64, 66.

J. Coolant Transfer System

Figure 6A:
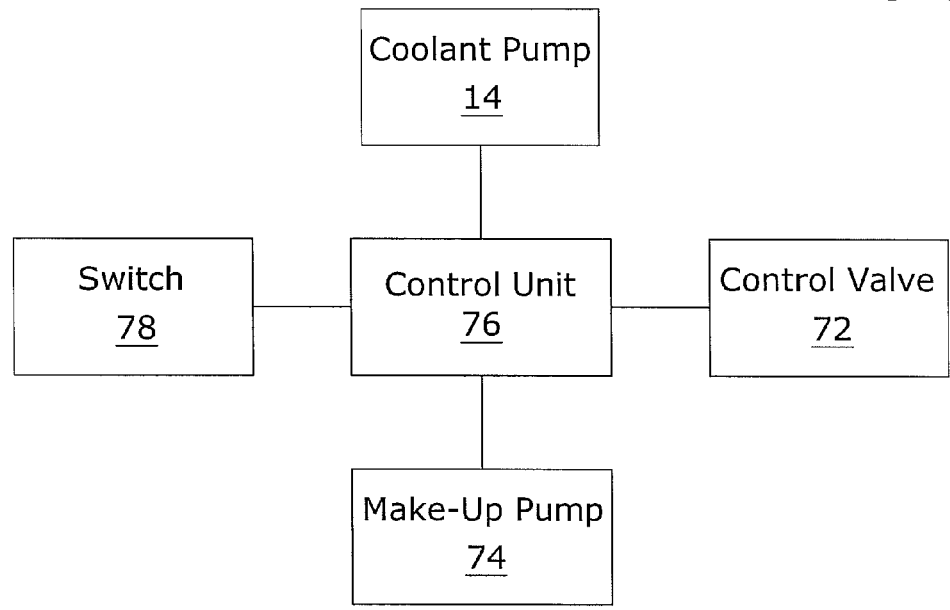
FIG. 6a is a block diagram illustrating the communications between the various components of the present invention.
Figure 6B:
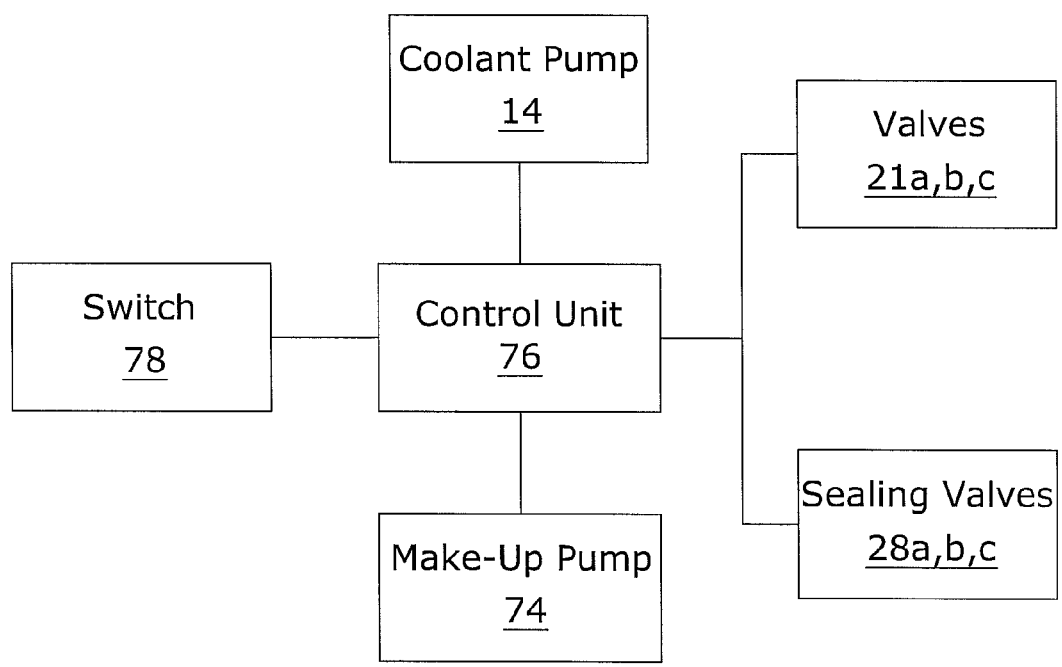
FIG. 6b is a block diagram illustrating the communications between the various components as illustrated in FIGS. 14 and 16 of the drawings.
Figure 7:
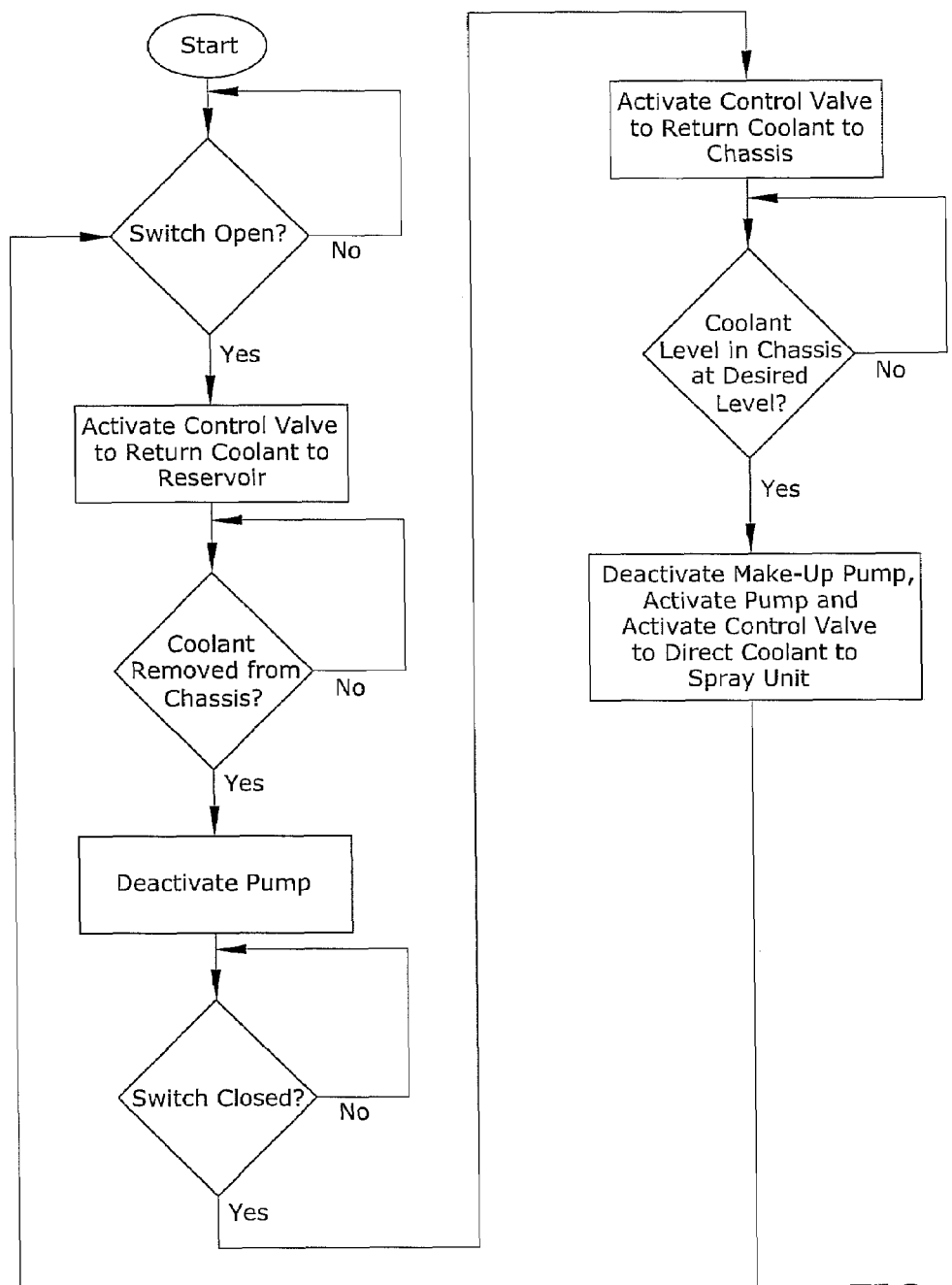
FIG. 7 is a flowchart illustrating the operation of the coolant control system of the present invention.

FIGS. 5, 6a and 6b illustrate a preferred coolant transfer system for the present invention that controls the location of the coolant based the state of the support unit 50 and a switch 78 to determine an open state or a closed state of the support unit 50 within the opening 30. FIG. 7 illustrates the overall operation of the coolant transfer system based upon the state of the support unit 50.

FIG. 6a illustrates a control unit 76 in communication with a coolant pump 14, a control valve 72, an auxiliary pump 74 and a switch 78. The switch 78 is attached to the chassis 20 or the support unit 50 to determine the state of the support unit 50 with respect to the chassis 20 (e.g. open, close). The switch 78 may be comprised of various types of switches such as but not limited to a mechanical switch, a pressure switch, an LED switch and the like. The switch 78 communicates the state of the support unit 50 to the control unit 76 which determines the operation of the coolant transfer system. FIG. 6b illustrates the control unit 76 in communication with the valves 21a, b, c and the sealing valves 28a, b, c to control the operation of the same based upon the state of the support unit 50 with respect to the chassis 20.

An interior reservoir 24 or an exterior reservoir 26 is provided that receives the coolant from the chassis 20 when the support unit 50 is removed from the chassis 20 as shown in FIGS. 5 and 8 of the drawings. The reservoir is preferably external of the chassis 20, however the reservoir 13 may be positioned within the chassis 20 in a manner separated from the opening 30 within the chassis 20 to prevent exposure of the coolant to the air (i.e. prevents the loss and contamination of the coolant).

The external reservoir 26 preferably is comprised of a structure that may be removed from the chassis 50 as desired. The external reservoir may also be comprised of a heat exchanger 29 as illustrated in FIG. 16 of the drawings.

In one embodiment, a control valve 72 is fluidly connected to an output port of the coolant pump 14. The control valve 72 is in communication with the control unit 76 which controls the position of the control valve 72. The control valve 72 is comprised of a 3-way valve which allows for the directing of the pressurized coolant to two different locations. The control valve 72 is fluidly connected to the reservoir 13 and to the liquid thermal management unit within the chassis 20 (e.g. spray unit 15) as shown in FIG. 5 of the drawings. The control valve 72 selectively directs coolant from the coolant pump 14 to either the liquid thermal management unit or the reservoir 24, 26 based on the state of the support unit 50.

As shown in FIGS. 5 and 8 of the drawings, an auxiliary pump 74 is fluidly connected to the reservoir 24, 26 to return coolant back to the chassis 20 when the support unit 50 is in a closed state as determined by the switch 78. The auxiliary pump 74 is not required if the reservoir 24, 26 is positioned above the chassis 20 to allow for gravity feeding of the coolant back to the chassis 20. If a gravity feed system is utilized for the reservoir 24, 26, a valve is used to control the flow of the returning coolant. The auxiliary pump 74 may be comprised of a smaller sized pump than the coolant pump 14 because of the relatively lower pressure and flow requirements. The auxiliary pump 74 can be used to move coolant into or out of the exterior reservoir 26 or the interior reservoir 24.

FIG. 16 illustrates the usage of a heat exchanger 29 positioned externally of the chassis 20 to receive and store a volume of coolant. The embodiment shown in FIG. 16 preferably includes three valves 21a, 21b, 21c to control the flow of coolant from the coolant pumps 14 and the auxiliary pump 74. The first valve 21a is utilized to control the return of the coolant back to the chassis 20 by the auxiliary pump 74 which is normally closed during operation of the coolant system. The auxiliary pump 74 may also be utilized to provide the coolant to the reservoir also. The second valve 21b is a three-way valve that directs the flow of the coolant directly to the spray unit 15 if no additional thermal conditioning of the coolant is required or first through the heat exchanger 29 if the coolant requires cooling before entering the spray unit 15. The third valve 21c is used to close the reservoir formed by the heat exchanger 29 when the heat exchanger 29 is filled with coolant by the coolant pumps 14 or by the auxiliary pump 74.

K. Operation of Preferred Embodiment

In use, the liquid thermal management unit thermally manages the heat producing devices 11 within the chassis 20 as illustrated in FIG. 5 of the drawings. When a user desires to access one or more of the thermal management devices on the support unit 50, the user performs a unit shutdown using the control system, which shuts down critical electronic devices being thermally managed. Fluid inside the chassis is then allowed to drain through perforations in the support unit 50 to the drain tube 73 then into the reservoir 24, 26, the user then grasps the handle 58 thereby causing the latching system to release the support unit 50.

In another embodiment, the liquid thermal management unit thermally manages the heat producing devices 11 within the chassis 20 as before. When a user desires to access one or more of the thermal management devices on the support unit 50, the user performs a unit shutdown using the control system, which shuts down critical electronic devices being thermally managed, changes the state of the three way valve allowing fluid to be pumped into the reservoir 24, 26 and then shuts the pump and control system down. The user then grasps the handle 58 thereby causing the latching system to release the support unit 50. The user continues to pull the support unit 50 from the chassis 20 after which the switch 78 detects the new open state of the support unit 50.

Once the state of the support unit 50 is determined to be "open", the control unit 76 activates the control valve 72 to direct the coolant from the coolant pump 14 to the reservoir 24, 26 until all of the coolant is removed from the chassis 20 as shown in FIG. 7 of the drawings. The coolant pump 14 is deactivated after the coolant has been removed from the chassis 20 as shown in FIG. 7 of the drawings. For this embodiment, it is preferred that the coolant pump 14 is not located in the support unit 50 but rather in the chassis 20.

Once the support unit 50 is partially or fully removed from the chassis 20, the user may then access, repair or replace individual components upon the support unit 50. Alternatively, the user may replace the entire support unit 50 containing the various liquid thermal management devices to allow for an efficient repair or maintenance of the thermal management system.

When the switch 78 is closed thereby detecting a "closed" state for the support unit 50 within the chassis 20, the control unit 76 switches the state of the valve then activates the auxiliary pump 74 to return coolant back to the chassis 20 as shown in FIG. 7 of the drawings. The auxiliary pump 74 continues to operate until the coolant level within the chassis 20 is to a desired level and then the auxiliary pump 74 is deactivated along with activating the coolant pump 14 to provide pressurized liquid coolant to the spray unit 15. The control valve 72 may need to be switched to direct the coolant to the spray unit 15 if not previously adjusted.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

I claim:

1. A liquid thermal management system, comprising:
  a chassis including an opening and an internal cavity;
  a liquid thermal management unit positioned within said chassis to thermally manage a heat producing device;
  a support unit slidably positioned within said opening, wherein said support unit seals said opening when in a closed state and wherein said support unit is at least partially removable from said chassis in an open state;
  a plurality of liquid thermal management devices attached to said support unit; and
  at least one intake valve attached to said support unit to collect coolant from within said internal cavity of said chassis externally of said support unit.

2. The liquid thermal management system of claim 1, wherein said plurality of liquid thermal management devices includes a coolant pump, a filter and heater.

3. The liquid thermal management system of claim 1, including a first rail attached within said chassis and a first guide attached to said support unit, wherein said first guide is slidably supported upon said first rail to slidably support said support unit.

4. The liquid thermal management system of claim 3, including a second rail attached within said chassis and a second guide attached to said support unit, wherein said second guide is slidably supported upon said second rail to slidably support said support unit.

5. The liquid thermal management system of claim 4, wherein said first guide and said second guide are attached to opposite sides of said support unit.

6. The liquid thermal management system of claim 5, wherein said first rail and said second rail are adjacent said opening.

7. The liquid thermal management system of claim 1, wherein said support unit includes a floor with at least one aperture to allow coolant to pass through.

8. The liquid thermal management system of claim 7, wherein said support unit includes an end member attached to a distal end of said floor, wherein said end member is broader than said opening and seals said opening when said support unit is in said closed state.

9. The liquid thermal management system of claim 8, including a handle attached to said end member.

10. The liquid thermal management system of claim 1, including a first electrical connector attached to said chassis and a second electrical connector attached to said support unit, wherein said second electrical connector is electrically connected to said first electrical connector when said support unit is in said closed state, wherein said second electrical connector is electrically connected to at least one of said plurality of liquid thermal management devices.

11. The liquid thermal management system of claim 1, including a first fluid connector attached to said chassis and a second fluid connector attached to said support unit, wherein said second fluid connector is fluidly connected to said first fluid connector when said support unit is in said closed state, and wherein said second fluid connector is fluidly connected to at least one of said plurality of liquid thermal management devices.

12. The liquid thermal management system of claim 1, including at least one guide aperture within said chassis and at least one guide member attached to said support unit, wherein said at least one guide member is positioned within said at least one guide aperture when said support unit is in a closed state.

13. The liquid thermal management system of claim 1, wherein said at least one intake valve is capable of opening or closing.

14. The liquid thermal management system of claim 1, including an intake port fluidly connected to said at least one intake valve, wherein said intake port extends outwardly from said support unit to collect coolant within said lower portion of said chassis.

15. The liquid thermal management system of claim 1, wherein said liquid thermal management unit is comprised of a spray unit to spray atomized coolant upon said heat producing device.

16. The liquid thermal management system of claim 1, including a switch to determine an open state or a closed state of said support unit within said opening.

17. The liquid thermal management system of claim 16, including a coolant pump and a reservoir, wherein said coolant pump transfers coolant from said chassis into a reservoir if said switch determines that said support unit is in said open state.

18. The liquid thermal management system of claim 17, including an auxiliary pump, wherein said auxiliary pump provides coolant to said chassis from said reservoir if said switch determines that said support unit is in said closed state.

19. The liquid thermal management system of claim 18, including a control valve fluidly connected to an output port of said coolant pump, wherein said control valve is fluidly connected to said reservoir and to said liquid thermal management unit, and wherein said control valve selectively directs coolant from said coolant pump to either said liquid thermal management unit or said reservoir.

20. The liquid thermal management system of claim 19, including a control unit in communication with said coolant pump, said control valve, said switch and said auxiliary pump.

21. The liquid thermal management system of claim 17, wherein said reservoir is positioned externally of said chassis.

22. A liquid thermal management system, comprising:
a chassis including an opening and a lower portion;
a liquid thermal management unit positioned within said chassis to thermally manage a heat producing device;
a support unit slidably positioned within said opening, wherein said support unit seals said opening when in a closed state and wherein said support unit is at least partially removable from said chassis in an open state;
a plurality of liquid thermal management devices attached to said support unit, wherein said plurality of liquid thermal management devices comprises a coolant pump and a filter;
a first rail attached within said chassis and a first guide attached to said support unit, wherein said first guide is slidably supported upon said first rail to slidably support said support unit;
a second rail attached within said chassis and a second guide attached to said support unit, wherein said second guide is slidably supported upon said second rail to slidably support said support unit;
wherein said first guide and said second guide are attached to opposite sides of said support unit;
a first electrical connector attached to said chassis and a second electrical connector attached to said support unit, wherein said second electrical connector is electrically connected to said first electrical connector when said support unit is in said closed state, and wherein said second electrical connector is electrically connected to at least one of said plurality of liquid thermal management devices;
a first fluid connector attached to said chassis and a second fluid connector attached to said support unit, wherein said second fluid connector is fluidly connected to said first fluid connector when said support unit is in said closed state, and wherein said second fluid connector is fluidly connected to at least one of said plurality of liquid thermal management devices; and
at least one intake valve attached to said support unit to collect coolant within said lower portion of said chassis externally of said support unit, wherein said at least one intake valve is fluidly connected to at least one of said plurality of liquid thermal management devices.

23. A liquid thermal management system, comprising:
a chassis including an opening;
a liquid thermal management unit positioned within said chassis to thermally manage a heat producing device;

a support unit slidably positioned within said opening, wherein said support unit seals said opening when in a closed state and wherein said support unit is at least partially removable from said chassis in an open state;

a plurality of liquid thermal management devices attached to said support unit;

a switch to determine an open state or a closed state of said support unit within said opening; and a coolant pump and a reservoir, wherein said coolant pump transfers coolant from said chassis into a reservoir if said switch determines that said support unit is in said open state.

24. The liquid thermal management system of claim 23, including an auxiliary pump, wherein said auxiliary pump provides coolant to said chassis from said reservoir if said switch determines that said support unit is in said closed state.

25. The liquid thermal management system of claim 24, including a control valve fluidly connected to an output port of said coolant pump, wherein said control valve is fluidly connected to said reservoir and to said liquid thermal management unit, and wherein said control valve selectively directs coolant from said coolant pump to either said liquid thermal management unit or said reservoir.

26. The liquid thermal management system of claim 25, including a control unit in communication with said coolant pump, said control valve, said switch and said auxiliary pump.

27. The liquid thermal management system of claim 23, wherein said reservoir is positioned externally of said chassis.

* * * * *